United States Patent [19]

Kawazu et al.

[11] Patent Number: 5,539,239

[45] Date of Patent: Jul. 23, 1996

[54] SEMICONDUCTOR LIGHT EMITTING ELEMENT WITH II-VI AND III-V COMPOUNDS

[75] Inventors: Zempei Kawazu; Tatsuya Kimura, both of Itami, Japan

[73] Assignee: Mitsubishi Denki Kabushiki Kaisha, Tokyo, Japan

[21] Appl. No.: 390,586

[22] Filed: Feb. 17, 1995

[30] Foreign Application Priority Data

Feb. 18, 1994 [JP] Japan .................................. 6-020846

[51] Int. Cl.$^6$ .................................................. H01L 33/00
[52] U.S. Cl. ............................. 257/94; 257/96; 257/97; 257/103; 372/45; 372/46; 372/44
[58] Field of Search ................................ 257/94, 95, 96, 257/97, 103, 13; 372/44, 45, 46

[56] References Cited

U.S. PATENT DOCUMENTS

| | | | |
|---|---|---|---|
| 4,994,867 | 2/1991 | Biegelsen | 257/200 X |
| 5,164,950 | 11/1992 | Yokotsuka et al. | 257/200 X |
| 5,416,337 | 5/1995 | Chang et al. | 257/18 X |

OTHER PUBLICATIONS

Capasso et al., "Pseudo–Quaternary GaInAsP Semiconductors: A New $GA_{0.47} IN_{0.53}$ AS/InP Graded Gap SuperLattice And its Application to Avalanche Photodiodes," *Appl. Phys. Lett.* 45(11), 1 Dec. 1984, pp. 1193–1195.

Tischler et al., "Defect Reduction in GaAs Epitaxial Layers Using A GaAsP–InGaAs Strained–Layer Superlattice," *Appl. Phys. Lett.* 46(3), 1 Feb. 1985, pp. 294–96.

Jeon et al, "Blue–green Injection Laser Diodes In (Zn,Cd) Se/ZnSe Quantum Wells", Applied Physics Letters, vol. 59, No. 27, 1991, pp. 3619–3621.

Onomura et al, "Blue–Green Laser Diode Operation of CdZnSe/ZnSe MOW Structures Grown on InGaP Band Offset Reduction Layers", Electronics Letters, Nov. 25, 1993, vol. 29, No. 24, pp. 2114–2115.

Haase et al, "Blue–green Laser Diodes", Applied Physics Letters, vol. 59, No. 11, 1991, pp. 1272–1274.

Lansari et al, "Improved Ohmic Contacts For P–Type And Related p–on–n Diode Structures", Applied Physics Letters, vol. 61, No. 21, 1992, pp. 2554–2556.

*Primary Examiner*—William Mintel
*Attorney, Agent, or Firm*—Leydig, Voit & Mayer

[57] ABSTRACT

A semiconductor light emitting element includes a wide band gap energy II–VI semiconductor layer on a p type III–V semiconductor substrate and a III–V semiconductor buffer layer between the semiconductor substrate and the wide band gap energy II–VI semiconductor layer having a band gap energy intermediate those of the semiconductor substrate and the wide band gap energy II–VI semiconductor layer. Energy spikes in the valence band of the element are reduced and the injection efficiency of holes is increased so that a semiconductor light emitting element having a low operation voltage is produced.

5 Claims, 9 Drawing Sheets

स्प्र5,539,239

SEMICONDUCTOR LIGHT EMITTING ELEMENT WITH II-VI AND III-V COMPOUNDS

FIELD OF THE INVENTION

The present invention relates to a semiconductor light emitting element having a wide band gap energy semiconductor layer (for example, a II–VI compound semiconductor layer such as ZnSe or ZnS) on a GaAs substrate.

BACKGROUND OF THE INVENTION

Recently, demands have been increasing for high density of recording and reproduction with an optical disc or an opto-magnetic disc requiring semiconductor lasers producing short wavelength light. Semiconductor lasers employing a II–VI compound semiconductor have been given attention as producing short wavelength light.

FIG. 4 is a schematic cross-sectional view illustrating a semiconductor laser described in *Applied Physics Letters*, Volume 59, 1991, at page 1272. The semiconductor laser of FIG. 4 includes an n type GaAs substrate 19, an n type GaAs buffer layer 18 disposed on the n type GaAs substrate 19, an $n^+$ type ZnSe layer 17 having a thickness of 0.1 μm and a dopant impurity concentration $n=1\times10^{18}$ cm$^{-3}$ disposed on the n type GaAs buffer layer 18, and an n type ZnSSe cladding layer 16 having a thickness of 2.5 μm and a Cl (chlorine) dopant impurity concentration of $n=1\times10^{18}$ cm$^3$ disposed on the $n^+$ type ZnSe layer 17. An n type ZnSe light confinement layer 15 having a thickness of 1 μm and a carrier concentration $n=1\times10^{18}$ cm$^3$ produced by Cl doping is disposed on the n type ZnSSe cladding layer 16, a CdZnSe quantum well layer 14 having a thickness of 100 Angstroms is disposed on the n type ZnSe light confinement layer 15, a p type ZnSe light confinement layer 13 having a thickness of 0.1 μm and a carrier concentration $p=2\times10^{17}$ cm$^{-3}$ produced by N (nitrogen) doping is disposed on the CdZnSe quantum well layer 14, a p type ZnSSe cladding layer 12 having a thickness of 1.5 μm and a carrier concentration $p=1\times10^{18}$ cm$^3$ produced by N doping is disposed on the p type ZnSe light confinement layer 13, and a $p^+$ type ZnSe contact layer 11 having a thickness of 0.1 μm and a carrier concentration $p=1\times10^{18}$ cm$^3$ produced by N doping is disposed on the p type ZnSSe cladding layer 12. An insulating layer 10 is disposed on the $p^+$ type ZnSe contact layer 11, a p side electrode 8 comprising Au or Pt or the like is disposed on the insulating layer 11, and an n side electrode 9 is disposed on the n type GaAs substrate 1 and comprises Au-Ge.

In the prior art semiconductor laser shown in FIG. 4, after growing the n type GaAs buffer layer 18 on the n type GaAs substrate 19, the $n^+$ type ZnSe layer 17, the n type ZnSSe cladding layer 16, the n type ZnSe light confinement layer 15, the CdZnSe quantum well layer 14 serving as an active layer, the p type ZnSe light confinement layer 13, the p type ZnSSe cladding layer 12, and the $p^+$ type ZnSe contact layer 11 are successively grown by molecular beam epitaxy.

Next, the insulating layer 10, such as polyimide, is formed on the $p^+$ type ZnSe contact layer 11 and etched, using photolithography, to form a stripe shape opening, the p side electrode 8 is formed in this opening, and the n side electrode 9 is formed on the n type GaAs substrate 19.

In the semiconductor laser shown in FIG. 4, when a forward direction bias is applied across the electrodes 8 and 9, between the n type GaAs substrate 19 and the $p^+$ type ZnSe contact layer 11, a current flowing through respective layers of the laser is confined by the insulating layer 10 and injected into the CdZnSe quantum well layer 14 serving as an active layer. The injected carriers are confined in the CdZnSe quantum well layer 14 to produce light emission by recombination.

Since the Fermi level, εf of FIG. 5, of p type ZnSe is quite far from the valence band, it forms a Schottky barrier about 1 eV or more in height with any metal. Accordingly, in the p/n type semiconductor laser shown in FIG. 4, a Schottky barrier is present between the p side electrode 8 comprising Au, Pt, or the like and the $p^+$ type ZnSe contact layer 11, as shown in FIG. 5, whereby a preferable ohmic characteristic is not obtained and holes are not injected effectively, increasing the operating voltage.

In a light emitting element having a p on n type structure comprising a p type wide band gap energy II–VI compound semiconductor layer on an n type III–V semiconductor layer, a preferable ohmic contact to the p type II–VI compound semiconductor layer shown in FIG. 4 is not obtained. On the other hand, it is possible to obtain a reasonable ohmic contact to the n type II–VI compound semiconductor layer, so a p type III–V compound semiconductor layer might be disposed on the n type II–VI compound semiconductor layer. However, the growth temperatures of respective layers are 600° to 700° C. for III–V layers and 250° to 400° C. for II–VI layers. Accordingly, when a III–V layer is deposited on the II–VI layer at 600° to 700° C., the II–VI layer is decomposed due to the high temperature or voids occur, making it impossible to deposit a p type III–V layer on the n type II–VI layer.

As a structure for solving this problem, an n/p type structure including an n type II–VI compound semiconductor layer on a p type III–V semiconductor layer as shown in FIG. 6 is described in *Applied Physics Letters*, Volume 59, 1991, at page 3619. In the laser structure of FIG. 6, a p type GaAs buffer layer 2 having a carrier concentration $p=1\times10^{18}$ cm$^3$ is disposed on a p type GaAs substrate (not shown). The structure includes a p type ZnSSe layer 22 having a thickness of 1.5 μm and a carrier concentration of $p=4\times10^{17}$ cm$^3$ produced by N doping, a p type ZnSe layer 23 having a thickness of 0.5 μm and a carrier concentration of $4\times10^{17}$ cm$^3$ produced by N doping, and a CdZnSe-ZnSe multi-quantum well layer 21 serving as an active layer. The laser structure also includes an n type ZnSe layer 24 having a thickness of 0.5 μm and a carrier concentration of $n=5\times10^{18}$ cm$^3$ produced by Cl doping, an n type ZnSSe layer 25 having a thickness of 1 μm and a carrier concentration $n=5\times10^{17}$ cm$^3$ produced by Cl doping, and an $n^+$ type ZnSe contact layer 26 having a thickness of 100 nm and a carrier concentration of $n=1\times10^{18}$ cm$^3$ produced by Cl doping.

In this structure, because an $n^+$ type ZnSe layer 26 is employed for the contact layer, a reasonably good ohmic contact characteristic is obtained. Here, Ti, Au-Zn, or the like is employed for the p side electrode at the GaAs substrate and In is employed for the n side electrode at the ZnSe layer 26.

The semiconductor laser shown in FIG. 6 may be fabricated as follows. After forming the p type GaAs buffer layer 20 on a p type GaAs substrate (not shown), the p type ZnSSe cladding layer 22, the p type ZnSe light confinement layer 23, the CdZnSe-ZnSe multi-quantum well layer 21 (the active layer), the n type ZnSe light confinement layer 24, the n type ZnSSe cladding layer 25, and the $n^+$ type ZnSe contact layer 26 are successively grown by MBE.

Next, an insulating film (not shown), such as polyimide, is formed on the $n^+$ type ZnSe contact layer 26, the insulating film is etched, using photolithography, to form a stripe opening, and an n side electrode comprising In is formed in this opening. On the opposite side of the GaAs substrate, the p side electrode comprising Ti, Au-Zn, or the like is formed.

In the semiconductor laser shown in FIG. 6, when a forward direction bias is applied across the electrodes between the p type GaAs substrate and the n$^+$ type ZnSe contact layer 26, injected carriers are confined in the CdZnSe-ZnSe multi-quantum well layer 21 and produce light emission by recombination.

In the prior art semiconductor laser shown in FIG. 6, however, an energy band discontinuity is caused by the band gap energy difference and electron affinity difference between the p type GaAs layer 20 and the p type ZnSSe cladding layer 22, whereby, as shown in FIG. 7, a spike S about 1.4 eV in height is formed in the valence band, thereby preventing the injection of holes into the active layer 21. Accordingly, in both n/p type and p/n type structures, the operating voltages are similarly high.

SUMMARY OF THE INVENTION

It is an object of the present invention to provide a semiconductor light emitting element having a low operating voltage.

It is another object of the present invention to provide a semiconductor light emitting element having improved reliability and laser characteristics.

Other objects and advantages of the present invention will become apparent from the detailed description given hereinafter; it should be understood, however, that the detailed description and specific embodiments are given by way of illustration only, since various changes and modifications within the scope of the invention will become apparent to those skilled in the art from this detailed description.

According to a semiconductor light emitting element of the present invention, a semiconductor layer is inserted between a III–V semiconductor substrate and a II–VI semiconductor layer, which layer has a band gap energy intermediate those of the other two layers, whereby spikes in the valence band are reduced to increase the injection efficiency of holes. Therefore, a semiconductor light emitting element having a low operating voltage is obtained.

More particularly, according to a first aspect of the present invention, in a semiconductor light emitting element comprising a wide band gap energy II–VI compound semiconductor layer epitaxially grown on a p type III–V semiconductor substrate, a buffer layer comprising a III–V semiconductor layer is inserted between the III–V semiconductor substrate and the II–VI compound semiconductor layer. The buffer layer has a band gap energy larger than that of the p type III–V semiconductor substrate and smaller than that of the II–VI compound semiconductor layer. Therefore, the spikes in the valence band are reduced and the hole injection efficiency is increased, whereby a semiconductor light emitting element having a low operating voltage is obtained.

According to a second aspect of the present invention, in the semiconductor light emitting element, the p type III–V semiconductor substrate is GaAs, the II–VI compound semiconductor layer is p type ZnSe, the III–V semiconductor layer inserted as the buffer layer is p type $(Al_xGa_{1-x})_yIn_{1-y}P$, and x and y are in the ranges of $0 \leq x \leq 1$ $0.16 < y \leq 1$.

Therefore, spikes in the valence band are reduced and the hole injection efficiency is increased, whereby a semiconductor light emitting element having a low operating voltage is obtained.

According to a third aspect of the present invention, in the semiconductor light emitting element, the values of compositions x and y of the p type $(Al_xGa_{1-x})_{1-y}P$ buffer layer are fixed. Therefore, spikes in the valence band are reduced and the hole injection efficiency is increased, whereby a semiconductor light emitting element having a low operating voltage is obtained.

According to a fourth aspect of the present invention, in the semiconductor light emitting element, the buffer layer has a composition producing a band gap energy gradually increasing from the p type III–V semiconductor substrate to the II–VI compound semiconductor layer. Therefore, spikes hardly exist in the valence band and movement of holes is hardly prevented. Further, the injection of carriers into the II–VI compound semiconductor layer is smooth, whereby the operating voltage of the light emitting element is significantly lowered.

According to a fifth aspect of the present invention, in the semiconductor light emitting element, the p type III–V semiconductor substrate is GaAs, the II–VI compound semiconductor layer is p type ZnSe, and the III–V semiconductor layer inserted as the buffer layer is p type $(Al_xGa_{1-x})_yIn_{1-y}P$, x and y are in the ranges of $0 \leq x \leq 1$ $0.16 < y \leq 1$, and the buffer layer has an band gap energy monotonically increasing from 1.42 eV to 2.45 eV in its growth direction. Therefore, since the band gap energy of the p type $(Al_xGa_{1-x})_yIn_{1-y}P$ buffer layer is in that range, the height of the spikes in the valence band becomes 0.25 eV or less at the most, and the injection of carriers into the p type ZnSe cladding layer 3 is smooth, whereby the operating voltage is significantly reduced.

According to a sixth aspect of the present invention, in the semiconductor light emitting element, a second buffer layer having a band gap energy between that of the buffer layer and that of the p type III–V compound semiconductor substrate is inserted between the buffer layer and the p type III–V compound semiconductor substrate. Therefore, differences between the band gap energies of the p type III–V semiconductor substrate and the second buffer layer, between the second buffer layer and the buffer layer, and between the buffer layer and the II–VI compound semiconductor layer are further reduced, whereby spikes in the valence band at respective interfaces are further reduced and the operating voltage is further reduced.

According to a seventh aspect of the present invention, in a semiconductor light emitting element, x and y of the p type $(Al_xGa_{1-x})_yIn_{1-y}P$ buffer layer are in the ranges of $0 \leq x \leq 1$ $0.16 < y \leq 1$, the second buffer layer is p type $Al_zGa_{1-z}As$ and has a band gap energy larger than that of GaAs and smaller than that of $(Al_xGa_{1-x})_yIn_{1-y}P$. Therefore, the band gap energy difference between the p type GaAs substrate and the p type $Al_zGa_{1-z}As$ second buffer layer, the band gap energy difference between the p type $Al_zGa_{1-x}As$ second buffer layer and the p type $(Al_xGa_{1-x})_yIn_{1-y}P$ buffer layer, and the band gap energy difference between the p type $(Al_xGa_{1-x})_yIn_{1-y}P$ buffer layer and the p type ZnSe cladding layer are further reduced and smaller than the band gap energy difference between the p type GaAs substrate and the p type ZnSe cladding layer, whereby spikes in the valence band at respective interfaces are further reduced and the operating voltage is further reduced.

According to an eighth aspect of the present invention, in the semiconductor light emitting element, the p type III–V semiconductor substrate is GaAs, the II–VI compound semiconductor layer is p type ZnSe, and the III–V semiconductor layer inserted as the buffer layer is an $Al_zGa_{1-z}As$ layer ($0<z\leq1$). Therefore, spikes in the valence band are reduced and the hole injection efficiency is increased, whereby a semiconductor light emitting element having a low operating voltage is obtained.

According to a ninth aspect of the present invention, in the semiconductor light emitting element, the III–V semiconductor layer inserted as the buffer layer lattice matches with the II–VI compound semiconductor layer. Therefore, in addition to the effect of reducing spikes in the valence band and enhancing the hole injection efficiency, thereby reducing the operating voltage, dislocations and defects at the interfaces between the III–V semiconductor buffer layer and the II–VI compound semiconductor layer due to lattice mismatch are reduced, thereby enhancing the crystallinity of the II–VI compound semiconductor layer, whereby a semiconductor laser having preferable reliability and characteristics is obtained.

According to a tenth aspect of the present invention, in the semiconductor light emitting element, the p type III–V semiconductor substrate is GaAs, the II–VI compound semiconductor layer is p type ZnSe, and the III–V semiconductor layer inserted as the buffer layer is p type $(Al_xGa_{1-x})_yIn_{1-y}P$ in which x and y are in the ranges of $0\leq x\leq 1$ $0.16<y\leq 1$, and the p type $(Al_xGa_{1-x})_yIn_{1-y}P$ layer has a lattice constant matching the lattice constant of the p type ZnSe cladding layer. Therefore, in addition to the effect of reducing spikes in the valence band and increasing the hole injection efficiency, thereby reducing the operating voltage, dislocations and defects at the interfaces between the p type ZnSe cladding layer and the p type $(Al_xGa_{1-x})_yIn_{1-y}P$ layer due to lattice mismatch are reduced, thereby enhancing the crystallinity of the p type ZnSe cladding layer, whereby a semiconductor laser having preferable reliability and characteristics is obtained.

According to an eleventh aspect of the present invention, in the semiconductor light emitting element, the lattice constant of the p type $(Al_xGa_{1-x})_yIn_{1-y}P$ buffer layer varies from the lattice constant of the p type GaAs substrate to the lattice constant of the p type ZnSe cladding layer. Therefore, in addition to the effect of reducing spikes in the valence band and increasing the hole injection efficiency, thereby reducing the operating voltage, the crystallinity of the p type ZnSe cladding layer can be enhanced and a concentration of dislocations and defects is avoided, whereby a semiconductor laser device having preferable reliability and characteristics is obtained.

According to a twelfth aspect of the present invention, in the semiconductor light emitting element, the p type $(Al_xGa_{1-x})_yIn_{1-y}P$ buffer layer has x and y in the ranges of $0\leq x\leq 1$ $0.16<y\leq 1$, to produce a band gap energy monotonically increasing from 1.42 eV to 2.45 eV along the growth direction of the buffer layer. Therefore, in addition to the effect of further reducing spikes in the valence band and increasing the hole injection efficiency, thereby reducing the operating voltage, the crystallinity of the p type ZnSe cladding layer can be enhanced and a concentration of dislocations and defects can be avoided, whereby a semiconductor laser having preferable reliability and characteristics is obtained.

According to a thirteenth aspect of the present invention, a semiconductor light emitting element which has, epitaxially grown, a II–VI compound semiconductor layer on a p type III–V semiconductor substrate includes a buffer layer disposed between the III–V semiconductor substrate and the II–VI compound semiconductor layer. The buffer layer comprises a III–V semiconductor layer having a band gap energy larger than the band gap energy of the substrate, and the III–V semiconductor layer having a still larger band gap energy is selectively formed as a current injecting region. Therefore, a current confinement structure can be formed with only a selectively formed region of the buffer layer and with only two epitaxial growth steps, whereby the semiconductor laser can be fabricated easily.

According to a fourteenth aspect of the present invention, in the semiconductor light emitting element, the $(Al_xGa_{1-x})_yIn_{1-y}P$ buffer layer is selectively grown on the GaAs substrate to form a current injecting region only at a selectively formed region of the $(Al_xGa_{1-x})_yIn_{1-y}P$ buffer layer. Therefore, a current confinement structure can be formed with only two epitaxial growth steps, whereby the semiconductor laser can be fabricated easily.

DETAILED DESCRIPTION OF THE PREFERRED EMBODIMENTS

Embodiment 1

Figure 1:
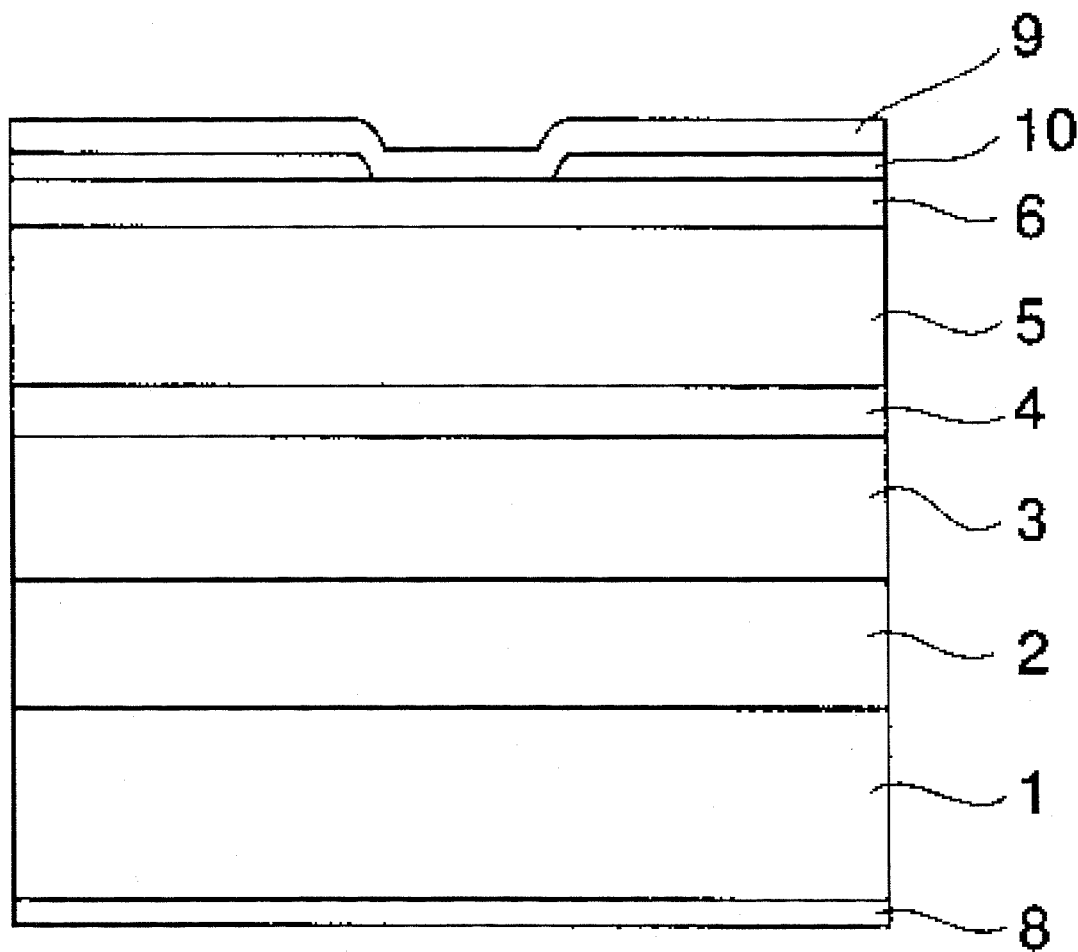
FIG. 1 is a cross-sectional view illustrating a semiconductor laser according to a first embodiment of the present invention.

FIG. 1 is a diagram illustrating a semiconductor laser device, a semiconductor light emitting element, according to a first embodiment of the present invention. The laser device of FIG. 1 includes a p type GaAs substrate 1, a p type $(Al_xGa_{1-x})_yIn_{1-y}P$ buffer layer 2 having a thickness of 1 μm and a carrier concentration of $p=1\times10^{18}$ cm$^{-3}$ produced by Zn, Mg, or Be doping and disposed on the p type GaAs substrate 1, a p type ZnSe cladding layer 3 having a thickness of 1 μm and a carrier concentration $p=4\times10^{17}$ cm$^{-3}$ produced by N doping and disposed on the p type $(Al_xGa_{1-x})_yIn_{1-y}P$ crystal layer (buffer layer) 2, an undoped ZnSe active layer 4 having a thickness of 100 Angstroms and disposed on the p type ZnSe cladding layer 3, an n type ZnSe cladding layer 5 having a thickness of 1 μm and a carrier concentration of $n=5\times10^{17}$ cm$^{-1}$ produced by Cl doping and disposed on the undoped ZnSe active layer 4, an n$^+$ type ZnSe contact layer 6 disposed on the n type ZnSe cladding layer 5 and having a thickness of 100 nm and a carrier concentration of $n=1\times10^{18}$ cm$^{-3}$ produced by Cl doping, a p side electrode 8 comprising Ti, Au-Zn, or the like disposed on the p type GaAs substrate 1, and an n side electrode 9 comprising In (indium) or the-like in contact with the n$^+$ type ZnSe contact layer 6 through a stripe-shaped aperture in an insulating film 10.

A process of making the semiconductor laser device according to the first embodiment includes, as shown in FIG. 1, locating a GaAs buffer layer (not shown) on the p type GaAs substrate 1 as required. The p type $(Al_xGa_{1-x})_yIn_{1-y}P$ buffer layer 2 is formed thereon by MBE, MOCVD (metal organic chemical vapor deposition), CBE (chemical beam epitaxy), or GSMBE (gas source molecular beam epitaxy). Then, the compositions x and y (x and y are atomic ratios) of the $(Al_xGa_{1-x})_yIn_{1-y}P$ buffer layer 2 are selected in ranges of $0 \leq x \leq 1$ $0.16 < y \leq 1$ so that the band gap energy of the buffer layer is larger than that of GaAs. Thereafter, the p type ZnSe cladding layer 3, the ZnSe active layer 4, the n type ZnSe cladding layer 5, and the n$^+$ type ZnSe contact layer 6 are successively epitaxially grown by MBE, MOCVD, CBE, GSMBE or the like.

For this layer structure, a p side electrode 8 comprising Ti or Au-Zn is formed on the rear surface of the p type GaAs substrate 1, and an n side electrode 9 comprising In in a stripe shape is formed on the n$^+$ type ZnSe contact layer 6 through the aperture in the insulating film 10.

Figure 8:
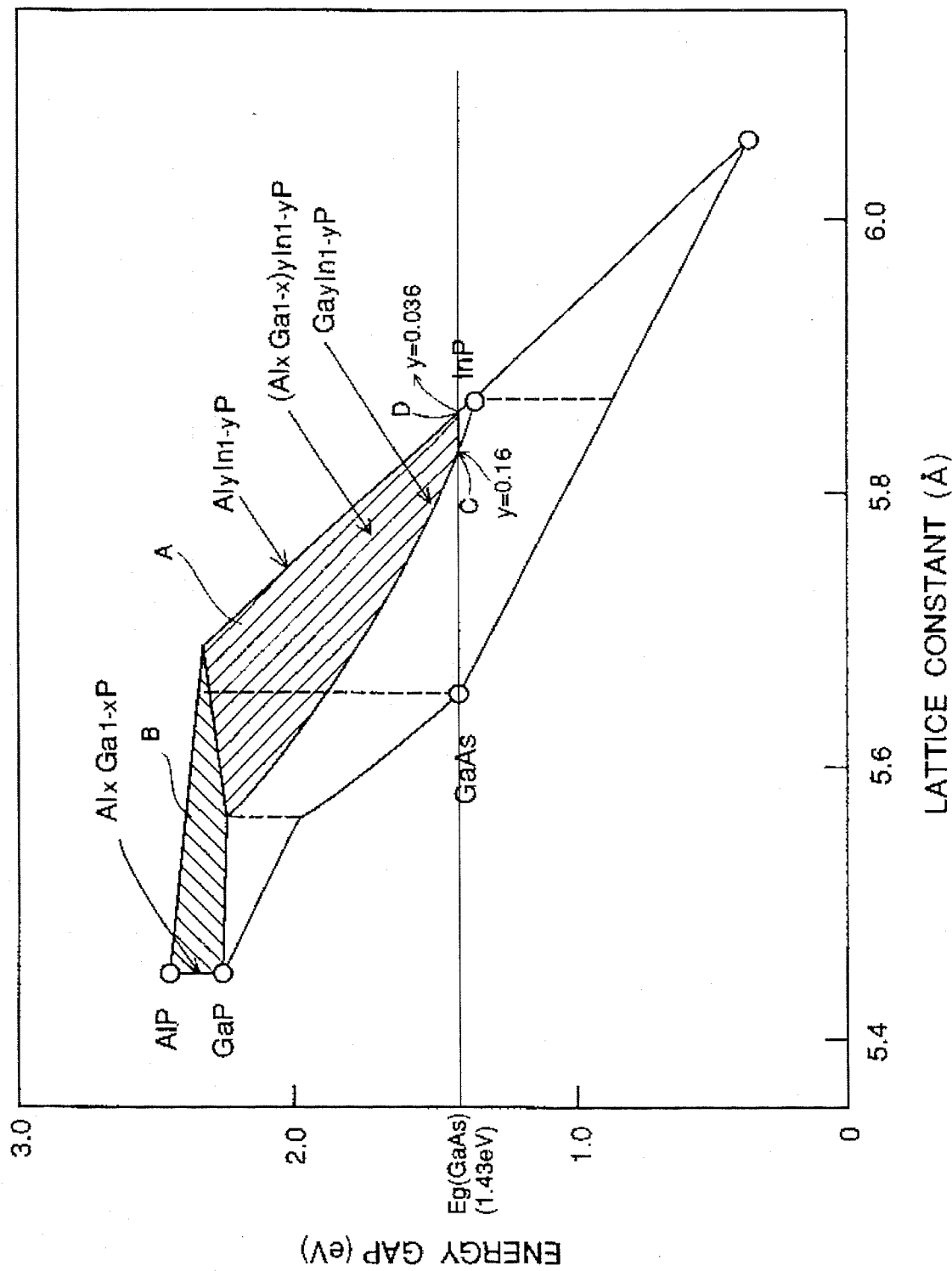
FIG. 8 is a diagram for explaining compositions x and y of the p type $(Al_xGa_{1-x})_yIn_{1-y}P$ buffer layer in semiconductor lasers according to first and second embodiments of the present invention.

The compositions x and y of the $(Al_xGa_{1-x})_yIn_{1-y}P$ buffer layer 2 are selected so that the band gap energy Eg is located in either of the hatched regions A or B of FIG. 8, where Eg is larger than the band gap energy of GaAs (=1.42 eV). In FIG. 8, the points C and D are points where the band gap energy Eg is equal to that of GaAs (=1.42 eV). At point C, $Ga_yIn_{1-y}P$, x=0 and y=0.16, while at point D, $Al_yIn_{1-y}P$, x=1 and y=0.036.

Figure 7:
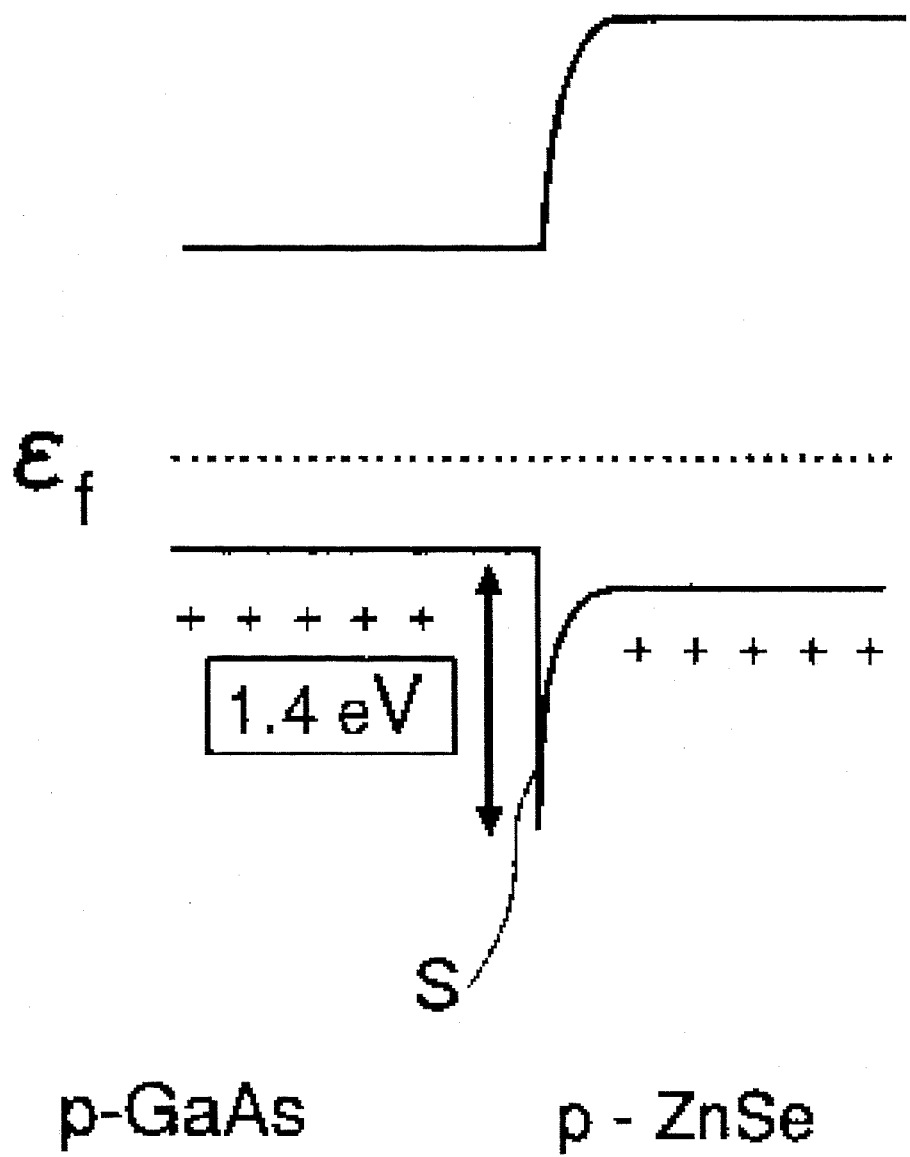
FIG. 7 is a diagram for explaining the II–VI semiconductor III–V semiconductor interface of the prior art II–V semiconductor laser of FIG. 6.

The band gap energy of the p type $(Al_xGa_{1-x})_yIn_{1-y}P$ buffer layer 2 between the p type GaAs substrate 1 and the p type ZnSe cladding layer 3 is larger than that of GaAs (1.42 eV) and x and y are located in either of the hatched regions A or B shown in FIG. 8. Therefore, the band gap energy differences between the p type GaAs substrate 1 and the p type $(Al_xGa_{1-x})_yIn_{1-y}P$ buffer layer 2 and between the $(Al_xGa_{1-x})_yIn_{1-y}P$ buffer layer 2 and the p type ZnSe cladding layer 3 (the band gap energy is 2.67 eV) are both smaller than that between the p type GaAs substrate 1 and the p type ZnSe cladding layer 3, thereby relaxing the energy discontinuity. Thereby, the spike S in the valence band between semiconductor layers in the prior art device as described with reference to FIG. 7 is reduced, and the injection of holes into the p type ZnSe cladding layer 3 while a forward direction bias is applied between the p type GaAs substrate 1 and the n$^+$ type ZnSe contact layer 6 is smooth, whereby the operating voltage is reduced.

In this semiconductor light emitting element according to the first embodiment, since a p type $(Al_xGa_{1-x})_yIn_{1-y}P$ buffer layer 2 having a band gap energy intermediate the band gap energies of the p type GaAs substrate 1 and the p type ZnSe cladding layer 3 is inserted between the p type GaAs substrate 1 and the p type ZnSe cladding layer 3, the band gap energy differences between the p type GaAs substrate 1 and the p type $(Al_xGa_{1-x})_yIn_{1-y}P$ buffer layer 2 and between the buffer layer 2 and the p type ZnSe cladding layer 3 are both smaller than the band gap energy difference between the p type GaAs substrate 1 and the p type ZnSe cladding layer 3 (1.25 eV), whereby the band discontinuity is relaxed to reduce the spikes in the valence band of the semiconductor layers that occur in the prior art device. Accordingly, injection of holes into the p type ZnSe cladding layer 3 when a forward direction bias is applied to the light emitting element is smooth, whereby the operating voltage is reduced.

Embodiment 2

In the first embodiment, the compositions x and y of the p type $(Al_xGa_{1-x})_yIn_{1-y}P$ buffer layer 2 are fixed values, i.e., constant, in the layer thickness direction. In this second embodiment, the compositions x and y of the p type $(Al_xGa_{1-x})_yIn_{1-y}P$ buffer layer 2 are such that the band gap energy of the buffer layer gradually increases from the p type GaAs substrate 1 toward the wide band gap energy p type ZnSe cladding layer 3.

A process of making a semiconductor laser device according to a second embodiment of the present invention includes, first of all, as shown in FIG. 1, forming a GaAs buffer layer (not shown) on the p type GaAs substrate 1 as required, and epitaxially growing thereon a p type $(Al_xGa_{1-x})_yIn_{1-y}P$ buffer layer 2 by MBE, MOCVD, CBE, GSMBE, or the like. As compositions of the $(Al_xGa_{1-x})_yIn_{1-y}P$ at the start of growth, x and y are selected in the ranges of $0 \leq x \leq 1$ $0.16 < y \leq 1$ so that the band gap energy is larger than that of GaAs. The values of x and y are varied so that the band gap energy monotonically increases with the growth of the layer 2, i.e., the point (x, y) rises during layer growth in the hatched regions A and B in FIG. 8.

Thereafter, as in the first embodiment, the p type ZnSe cladding layer 3, the ZnSe active layer 4, the n type ZnSe cladding layer 5, and the n$^+$ type ZnSe contact layer 6 are successively epitaxially grown by MBE, MOCVD, CBE, GSMBE or the like, thereby fabricating a laser structure.

In the semiconductor laser device according to this second embodiment, since the band gap energy of the p type $(Al_xGa_{1-x})_yIn_{1-y}P$ buffer layer 2 gradually increases in the range from 1.42 eV (GaAs) to 2.45 eV (AlP), it reduces spikes in the valence band if the band gap energy of the p type $(Al_xGa_{1-x})_yIn_{1-y}P$ buffer layer 2 is in this range, thereby hardly preventing the movement of holes. In addition, because of the band gap energy difference between AlP (Eg)=2.45 eV and ZnSe (Eg)=2.67 eV, the height of the spike in the valence band between semiconductor layers becomes 0.25 eV or less at the most, thereby making the injection of carriers into the p type ZnSe cladding layer 3 smooth and reducing the operating voltage.

Embodiment 3

Figure 2:
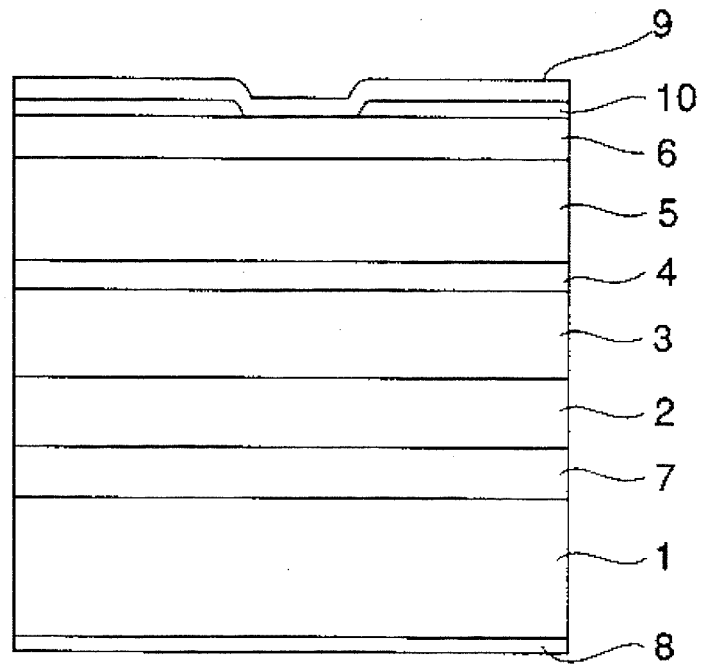
FIG. 2 is a cross-sectional view illustrating a semiconductor laser according to a third embodiment of the present invention.

FIG. 2 shows a semiconductor light emitting element according to a third embodiment of the present invention.

In the first and second embodiments, a p type $(Al_xGa_{1-x})_yIn_{1-y}P$ buffer layer 2 is inserted between the p type GaAs substrate 1 and the p type ZnSe cladding layer 3 to relax the band gap energy discontinuity between the p type GaAs substrate 1 and the p type ZnSe cladding layer 3. In this third embodiment, a p type $Al_zGa_{1-z}As$ ($0<z\leq 1$) second buffer layer 7 is inserted between the p type GaAs substrate 1 and the p type $(Al_xGa_{1-x})_yIn_{1-y}P$ buffer layer 2.

Figure 9:
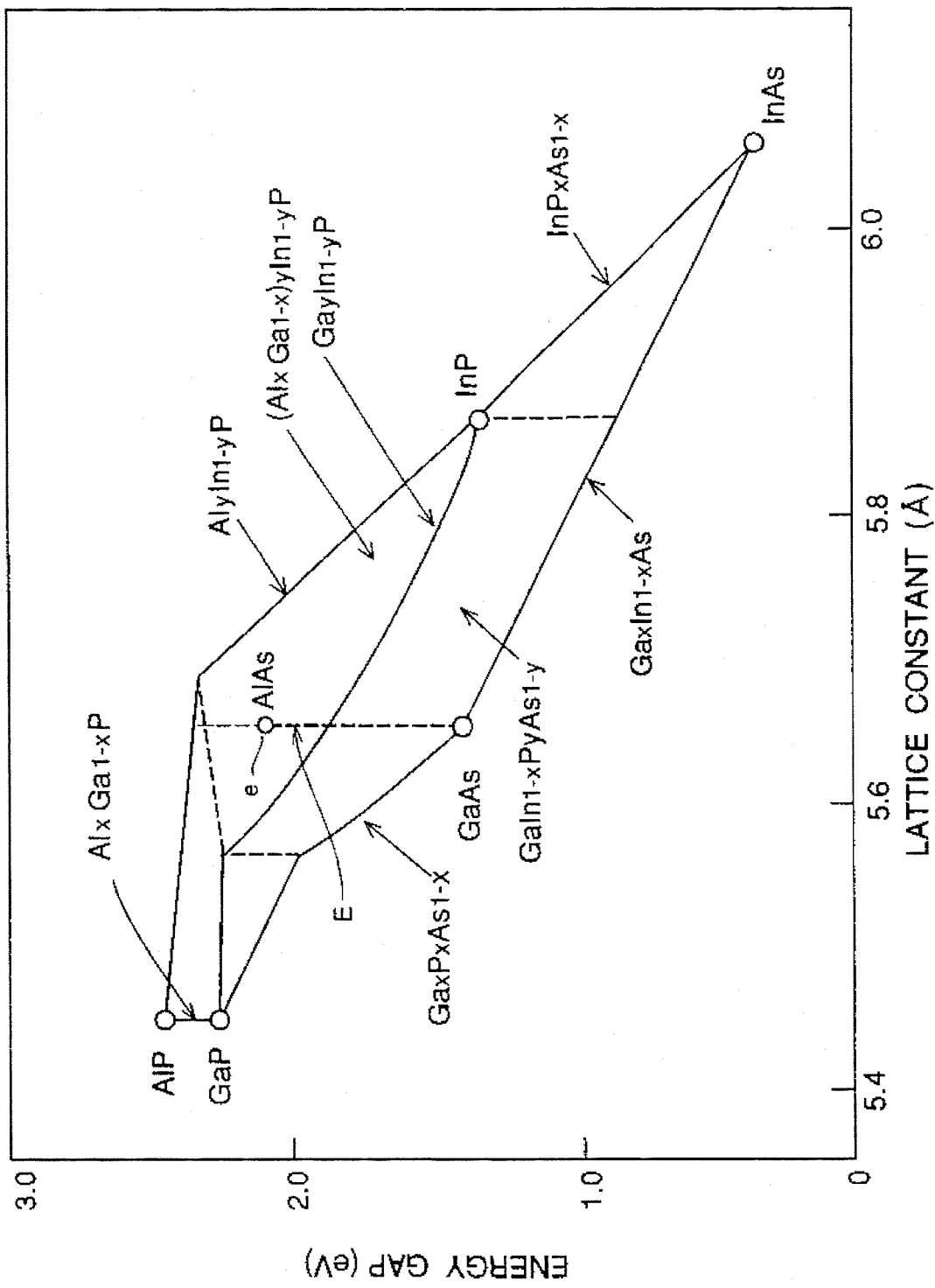
FIG. 9 is a diagram for explaining compositions x and y of the p type $(Al_xGa_{1-x})_yIn_{1-y}P$ buffer layer in a semiconductor laser according to a third embodiment of the present invention.

A process of making a semiconductor laser device according to a third embodiment of the present invention includes, as shown in FIG. 2, forming a GaAs buffer layer on the p type GaAs substrate 1, as required, although not shown here, and growing thereon a p type $Al_xGa_{1-x}As$ ($0<z\leq 1$) layer 7, as a second buffer layer, by MBE, MOCVD, CBE, GSMBE or the like. At this time, the composition z of the p type $Al_zGa_{1-z}As$ layer 7 is determined so that the band gap energy of the p type $Al_zGa_{1-z}As$ layer 7 is larger than that of GaAs and smaller than that of $(Al_xGa_{1-x})_yIn_{1-y}P$. More particularly, in FIG. 9, the point on the dotted line E represents p type $Al_zGa_{1-z}As$ ($0<z\leq 1$), and the point at the lower end of the dotted line E represents GaAs, $z=0$, and the point e at the upper end of the dotted line E is AlAs, $z=1$.

Thereafter, on the p type $Al_zGa_{1-z}As$ layer 7, a p type $(Al_xGa_{1-x})_yIn_{1-y}P$ buffer layer 2, a p type ZnSe cladding layer 3, a ZnSe active layer 4, an n type ZnSe cladding layer 5, and an $n^+$ type ZnSe contact layer 6 are successively epitaxially grown by MBE, MOCVD, CBE, GSMBE, or the like, thereby fabricating a laser structure.

In this third embodiment, the band gap energy differences between the p type GaAs substrate i and the p type $Al_zGa_{1-z}As$ layer 7, between the p type $Al_zGa_{1-z}As$ layer 7 and the p type $(Al_xGa_{1-x})_yIn_{1-y}P$ layer 2, and between the p type $(Al_xGa_{1-x})_yIn_{1-y}P$ layer 2 and the p type ZnSe cladding layer 3, respectively, are smaller than the band gap energy difference between the p type GaAs substrate 1 and the p type ZnSe cladding layer 3. For example, for the band gap energy 1.42 eV of the p type GaAs substrate 1, the band gap energy is varied from 1.42 eV to 1.8 eV in the p type $Al_zGa_{1-z}As$ layer 7, and varied from 1.8 eV to 2.45 eV (ALP) in the p type $(Al_xGa_{1-x})_yIn_{1-y}P$ layer 2, to produce a structure in contact with a p type ZnSe cladding layer 3 through the layer 2. Therefore, spikes in the valence band at respective interfaces are further reduced, whereby the operating voltage of the semiconductor laser can be further reduced.

Embodiment 4

In the third embodiment, a p type $(Al_xGa_{1-x})_yIn_{1-y}P$ buffer layer 2 and a p type $Al_zGa_{1-z}As$ ($0<z\leq 1$) second buffer layer 7 are inserted between the p type GaAs substrate 1 and the p type ZnSe cladding layer 3 to relax the energy discontinuity between the p type GaAs substrate 1 and the p type ZnSe cladding layer 3. In the semiconductor light emitting element of this fourth embodiment, only a p $Al_zGa_{1-z}As$ ($0<z\leq 1$) buffer layer is inserted between the p type GaAs substrate 1 and the p type ZnSe cladding layer 3, which corresponds to replacing the p type $(Al_xGa_{1-x})_yIn_{1-y}P$ buffer layer 2 in FIG. 1 with a p type $Al_zGa_{1-z}As$ ($0<z\leq 1$) layer.

In this fourth embodiment, by inserting a p type $Al_zGa_{1-z}As$ layer between the p type GaAs substrate 1 and the p type ZnSe cladding layer 3, the band gap energy changes from the band gap energy of GaAs to the band gap energy of AlAs in the p type $Al_zGa_{1-z}As$ layer 7, and that layer contacts a p type ZnSe cladding layer 3. Also in this structure, the spike in the valence band at the respective interfaces is reduced, whereby the operating voltage of the semiconductor laser is reduced.

Embodiment 5

In a fifth embodiment of the present invention, the p type $(Al_xGa_{1-x})_yIn_{1-y}P$ layer 2 has a lattice constant that matches that of the p type ZnSe cladding layer 3 in the structure shown in FIG. 1.

A process of making the semiconductor laser device according to the fifth embodiment of the present invention includes, as in the first embodiment, epitaxially growing a p type $(Al_xGa_{1-x})_yIn_{1-y}P$ layer 2 on the p type GaAs substrate 1. The compositions x and y of the p type $(Al_xGa_{1-x})_yIn_{2-y}P$ buffer layer 2 are $0<x\leq 1$ $y=0.481$ so that the band gap energy of the p type $(Al_xGa_{1-x})_yIn_{1-y}P$ buffer layer 2 is larger than that of GaAs and the buffer layer lattice matches with ZnSe. More particularly, in FIG. 10, the solid line F represents $(Al_xGa_{1-x})_yIn_{1-y}P$ having a lattice constant of 5.6687 Angstroms that lattice matches with ZnSe, and the dotted line G represents $(Al_xGa_{1-x})_yIn_{1-y}P$ having a lattice constant of 5,653 Angstroms that lattice matches with GaAs. The compositions x and y of the p type $(Al_xGa_{z-x})_yIn_{1-y}P$ buffer layer 2 lie on the solid line F.

Figure 10:
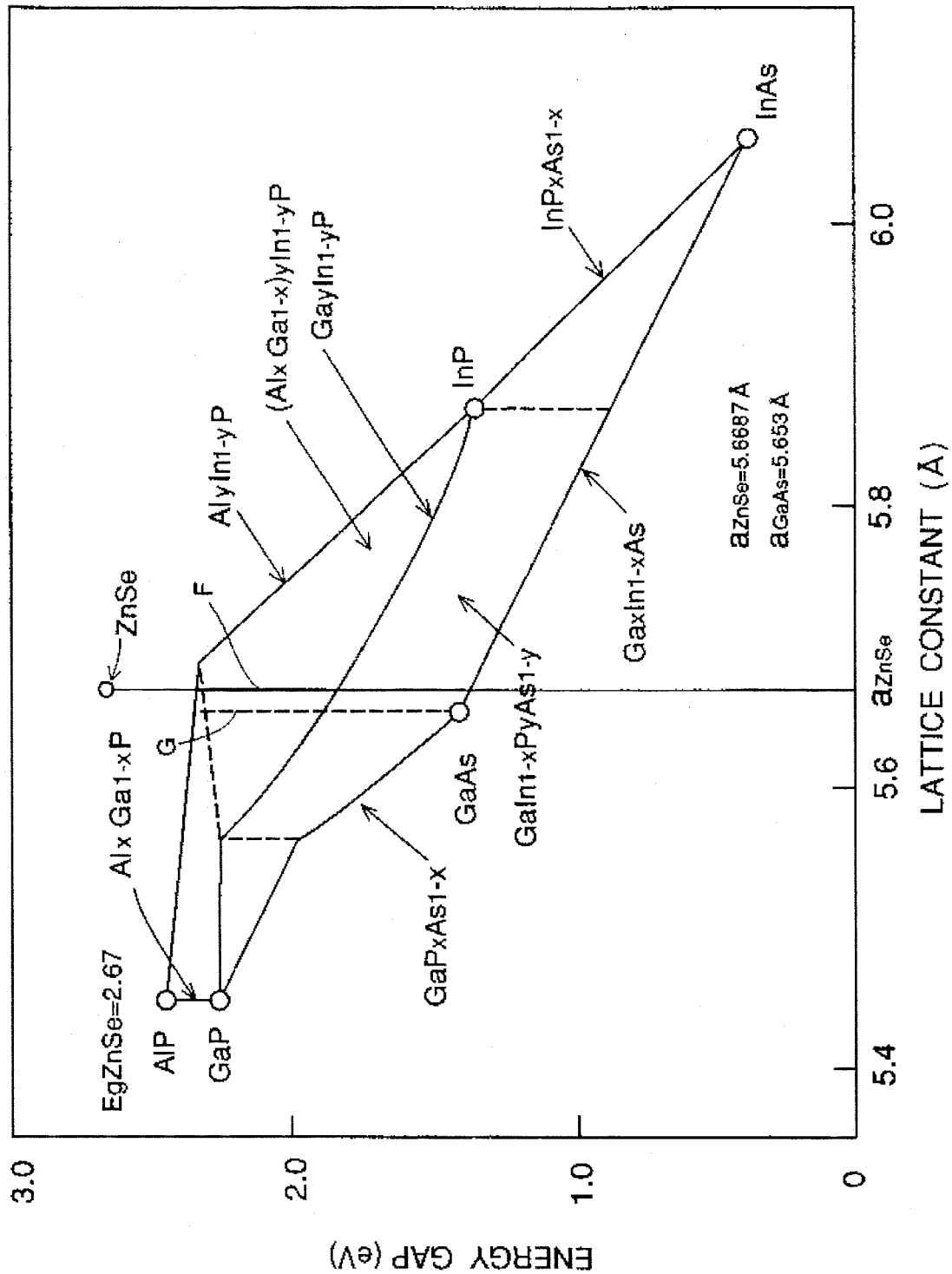
FIG. 10 is a diagram for explaining compositions x and y of the p type $(Al_xGa_{1-x})_yIn_{1-y}P$ buffer layer in the semiconductor lasers according to fifth and sixth embodiments of the present invention.
Figure 11:
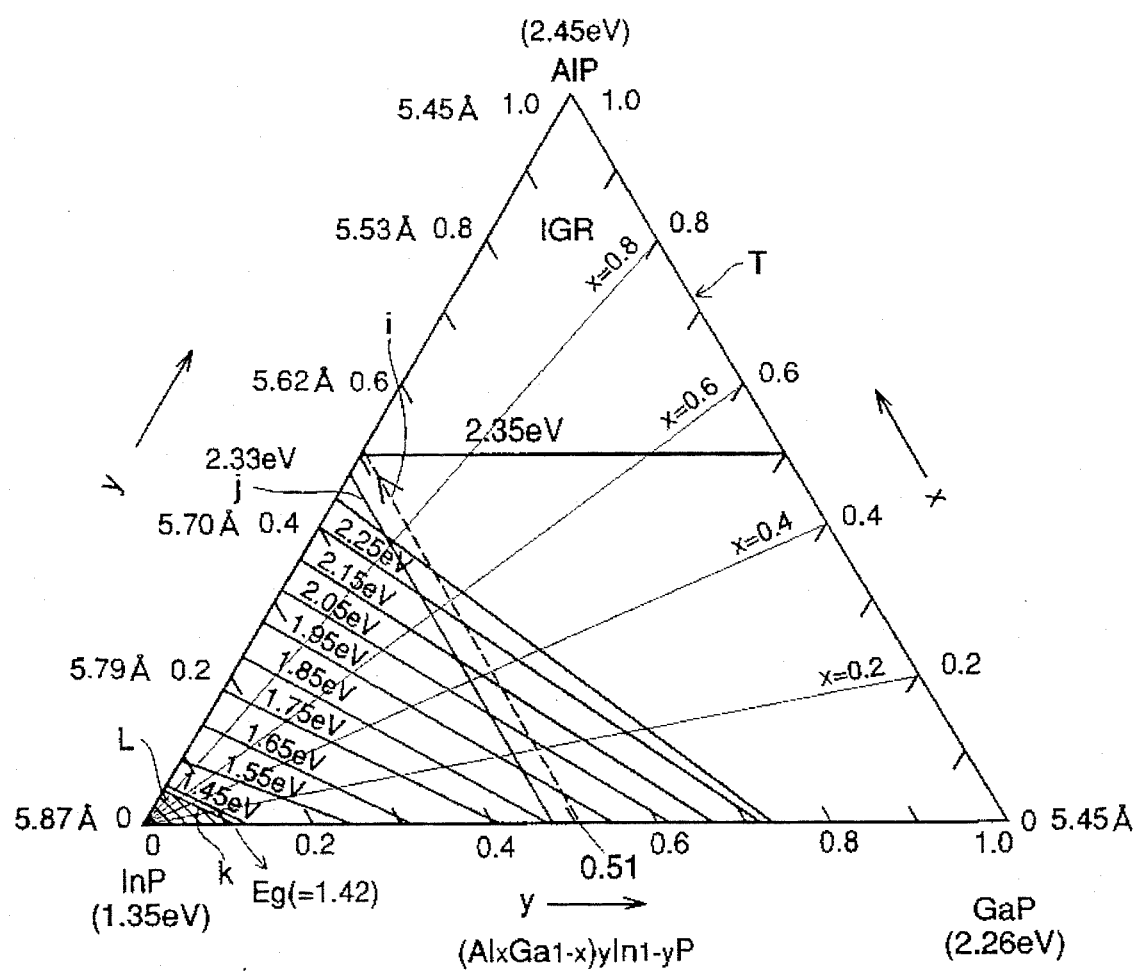
FIG. 11 is a diagram for explaining compositions x and y of the p type $(Al_xGa_{1-x})_yIn_{1-y}P$ buffer layer in semiconductor lasers according to fifth and sixth embodiments of the present invention.

FIG. 11 shows a triangle T that represents an x-y composition plane of $(Al_xGa_{1-x})_yIn_{1-y}P$. The solid lines sloping downward to the right in the triangle T represent constant direct band gap energies, k represents the band gap energy of GaAs (=1.42 eV), and L represents a region having a band gap energy equal to or below that of GaAs (1.42 eV). The IGR (indirect gap region) represents an indirect gap region and a solid line at its bottom edge represents a band gap energy of 2.35 eV. The dotted line i represents the lattice constant of GaAs, and it shows that, when $y=0.51$ and $x=0$ to 1.0, there is a lattice match with GaAs, and j represents a lattice match with ZnSe. These dotted lines i and j respectively correspond to the solid lines G and F in FIG. 10.

Thereafter, as in the first embodiment, the p type ZnSe cladding layer 3, the ZnSe active layer 4, the n type ZnSe cladding layer 5, and the $n^+$ type ZnSe contact layer 6 are successively epitaxially grown by MBE, MOCVD, CBE, GSMBE, or the like, thereby fabricating a laser structure. In this fifth embodiment, two epitaxial growth steps are required.

In this fifth embodiment, the lattice constant of the p type $(Al_xGa_{1-x})_yIn_{1-y}P$ buffer layer 2 is equal to the lattice constant of the p type ZnSe cladding layer 3. Therefore, in addition to the effects of reducing spikes in the valence band and enhancing hole injection efficiency, thereby reducing the operating voltage, dislocations and defects at the interfaces between both layers 2 and 3 due to lattice mismatching are reduced, thereby enhancing the crystallinity of the p type ZnSe cladding layer 3. Therefore, a semiconductor laser having preferable reliability and characteristics is obtained.

Embodiment 6

In a sixth embodiment of the present invention, the lattice constant of the p type $(Al_xGa_{1-x})_yIn_{1-y}P$ buffer layer 2 gradually varies from the lattice constant of GaAs to that of ZnSe in the structure of FIG. 1.

A process of making the semiconductor laser device according to the sixth embodiment of the present invention includes, as in the first embodiment, epitaxially growing a p type $(Al_xGa_{1-x})_yIn_{1-y}P$ buffer layer 2 on the p type GaAs substrate 1. The composition ratio y ($0<x\leq 1$) of the p type $(Al_xGa_{1-x})_yIn_{1-y}P$ buffer layer 2 is monotonically varied from 0.516, which produces a lattice match with GaAs, to 0.481, which produces a lattice match with ZnSe.

This lattice matching is described with reference to FIGS. 10 and 11. The composition ratio y ($0<x\leq 1$) of the p type $(Al_xGa_{1-x})_yIn_{1-y}P$ buffer layer 2 is monotonically varied from a line G in FIG. 10 and a line i in FIG. 11, producing a lattice match with GaAs, to a line F in FIG. 10 and a line j in FIG. 11 that produce a lattice match with ZnSe. In FIG. 11, a point (x, y) is moved from rightwards and upwards.

Thereafter, as in the first embodiment, the p type ZnSe cladding layer 3, the ZnSe active layer 4, the n type ZnSe cladding layer 5, and the n$^+$ type ZnSe contact layer 6 are successively epitaxially grown by MBE, MOCVD, CBE, GSMBE, or the like, thereby fabricating a laser structure.

In the semiconductor laser device according to this sixth embodiment, the p type $(Al_xGa_{1-x})_yIn_{1-y}P$ buffer layer 2 is gradually varied from a lattice match with the p type GaAs substrate 1 to a lattice match with the p type ZnSe cladding layer 3. Therefore, in addition to the effects of reducing spikes in the valence band and enhancing the hole injection efficiency, thereby reducing the operating voltage, dislocations and defects at the interfaces between both layers 2 and 3 due to lattice mismatching are reduced, thereby enhancing the crystallinity of the p type ZnSe cladding layer 3. Therefore, a semiconductor laser having preferable reliability and laser characteristics is obtained.

Embodiment 7

In a seventh embodiment of the present invention, the lattice constant of the p type $(Al_xGa_{1-x})_yIn_{1-y}P$ buffer layer 2 gradually varies from the lattice constant of GaAs to that of ZnSe, as in the above sixth embodiment and the band gap energy is also monotonically varied.

In fabricating the semiconductor laser device according to the seventh embodiment of the present invention, as in the first embodiment, a p type $(Al_xGa_{1-x})_yIn_{1-y}P$ buffer layer 2 is epitaxially grown on the p type GaAs substrate 1. The composition ratio y of the p type $(Al_xGa_{1-x})_yIn_{1-y}P$ buffer layer 2, as in the sixth embodiment, is monotonically varied from 0.516, which produces a lattice match with GaAs, to 0.481, which produces a lattice match with ZnSe, and the composition ratio x is also monotonically increased to increase the band gap energy monotonically. In FIG. 11, a point (x, y) is moved from a line i to a line j, toward the right and upward, farther than in the sixth embodiment.

Thereafter, as in the first embodiment, the p type ZnSe cladding layer 3, the ZnSe active layer 4, the n type ZnSe cladding layer 5, and the n$^+$ type ZnSe contact layer 6 are successively epitaxially grown by MBE, MOCVD, CBE, GSMBE, or the like, thereby fabricating a laser structure.

In the semiconductor laser device according to this seventh embodiment, as in the sixth embodiment, the p type $(Al_xGa_{1-x})_yIn_{1-y}P$ buffer layer 2 is gradually varied from a lattice match with the p type GaAs substrate 1 to a lattice match with the p type ZnSe cladding layer 3, and the band gap energy of the p type $(Al_xGa_{1-x})_yIn_{1-y}P$ buffer layer 2 is gradually increased. Therefore, in addition to the effects of reducing spikes due to the energy discontinuity between semiconductor layers and enhancing hole injection efficiency, thereby reducing the operating voltage, dislocations and defects at the interfaces between both layers 2 and 3 due to lattice mismatching are reduced, thereby enhancing the crystallinity of the p type ZnSe cladding layer 3. Therefore, a semiconductor laser device having preferable reliability and characteristics is obtained.

Embodiment 8

Figure 3:
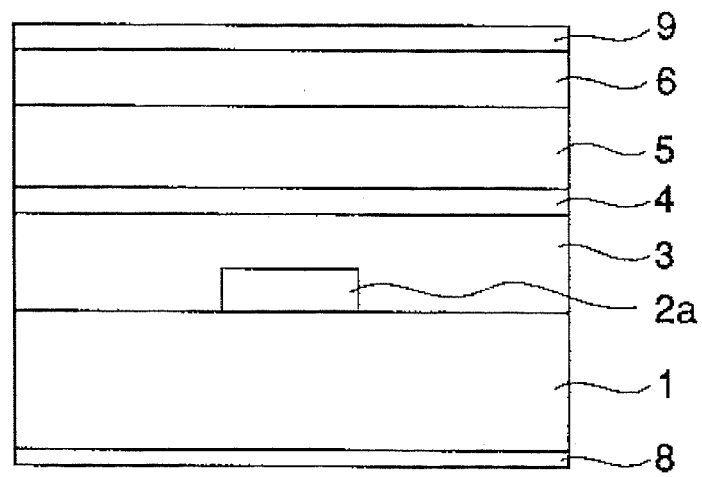
FIG. 3 is a cross-sectional view illustrating a semiconductor laser according to an eighth embodiment of the present invention.
Figure 4:
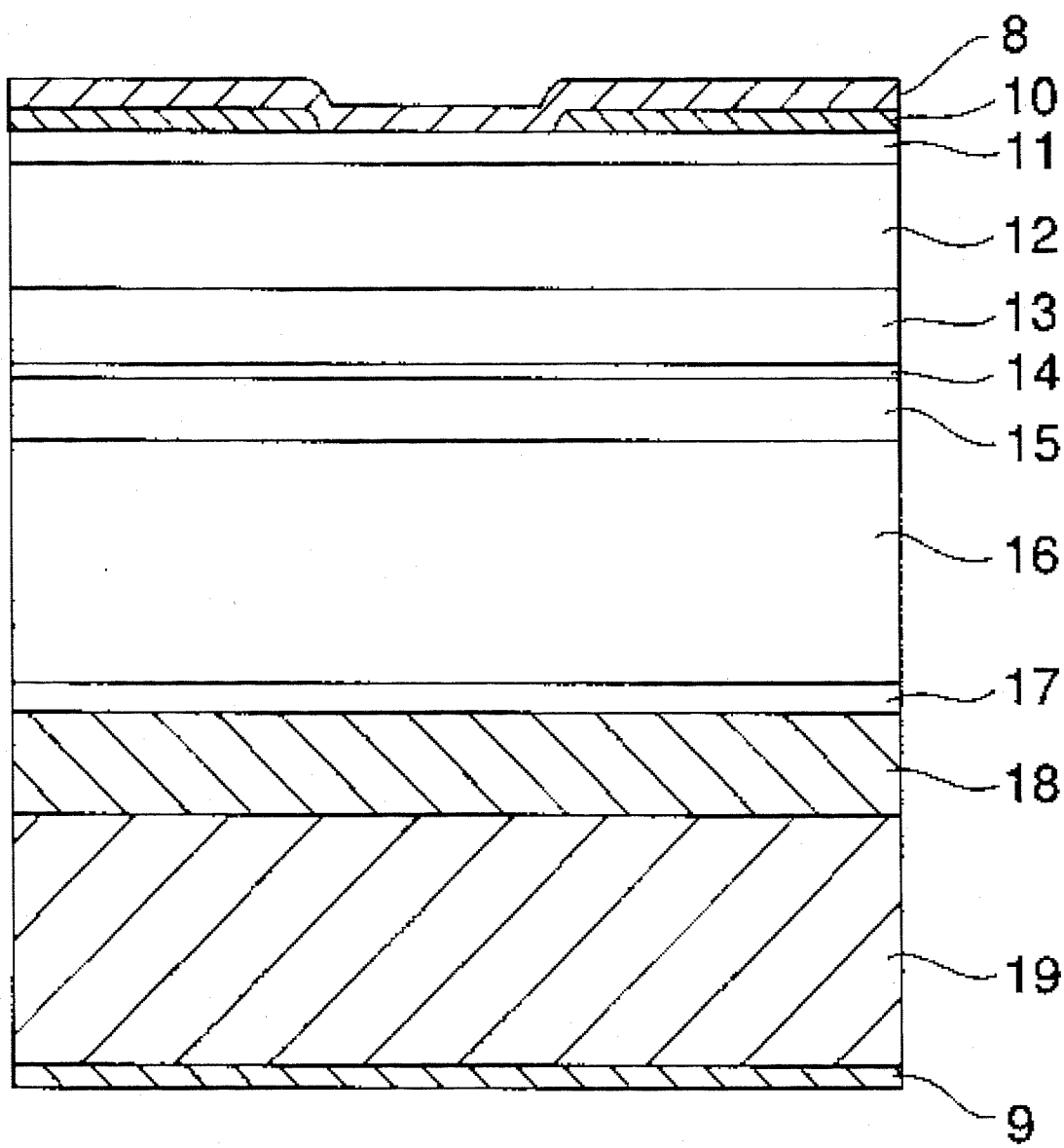
FIG. 4 is a cross-sectional view illustrating a II–VI semiconductor laser according to a first prior art example.
Figure 5:
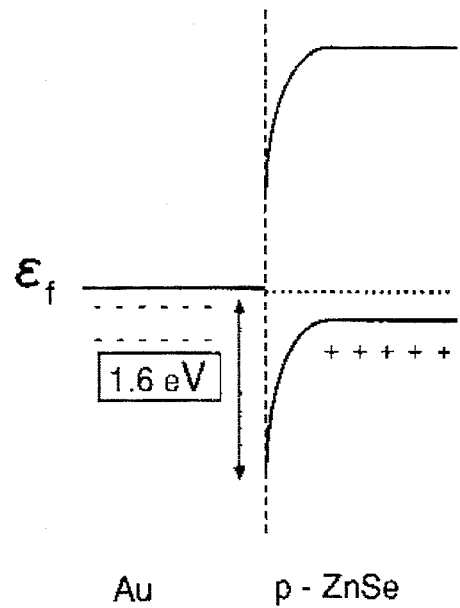
FIG. 5 is a diagram for explaining the electrode-semiconductor interface of the prior art II–VI semiconductor laser of FIG. 4.
Figure 6:
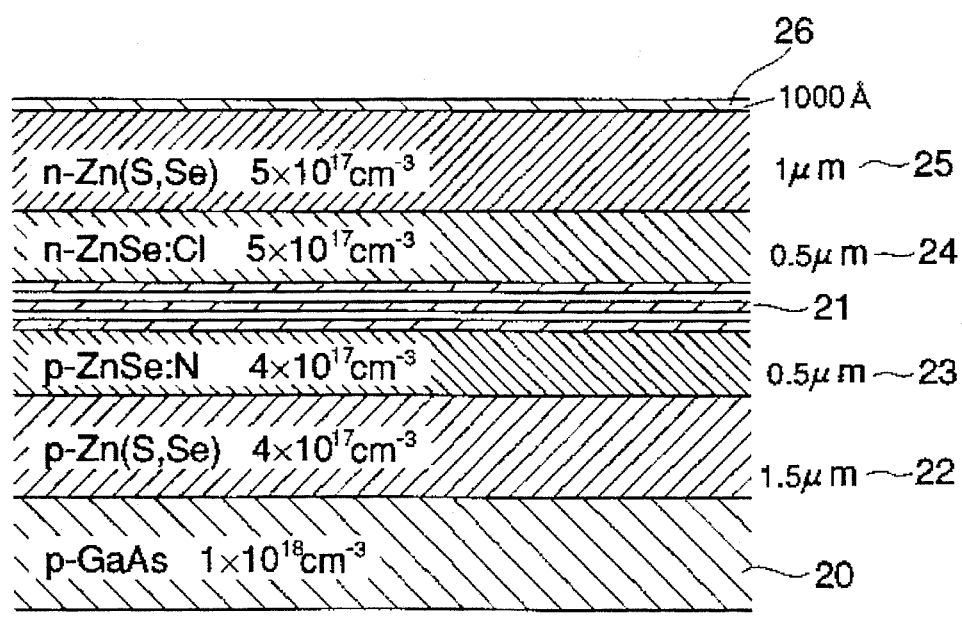
FIG. 6 is a cross-sectional view illustrating a II–VI semiconductor laser according to a second prior art example.

FIG. 3 shows a semiconductor light emitting element according to an eighth embodiment of the present invention.

In FIG. 3, reference numerals 1, 3, 4, 5, 6, 8, and 9 designate the same elements as in FIGS. 1 and 2, and reference numeral 2a designates a p type $(Al_xGa_{1-x})_yIn_{1-y}P$ buffer layer present only at a current injecting region.

A method for fabricating a semiconductor light emitting element according to the eighth embodiment of the present invention includes, as shown in FIG. 3, forming a GaAs buffer layer (not shown) on the p type GaAs substrate 1 as occasion requires and growing a p type $(Al_xGa_{1-x})_yIn_{1-y}P$ buffer layer 2 thereon by MBE, MOCVD, CBE, GSMBE or the like. At this time, the composition of the p type $(Al_xGa_{1-x})_yIn_{1-y}P$ buffer layer 2 is determined as in any of the first, second, third, fifth, sixth, and seventh embodiments.

Thereafter, the p type $(Al_xGa_{1-x})_yIn_{1-y}P$ buffer layer 2 is selectively etched and removed using photolithography, and the p type $(Al_xGa_{1-x})_yIn_{1-y}P$ buffer layer 2a is left only at a current injecting region. In more detail, a portion other than the current injecting region of the p type $(Al_xGa_{1-x})_yIn_{1-y}P$ layer 2 is removed by wet etching with hydrochloric acid or dry etching with chlorine, employing a photoresist, to leave the p type $(Al_xGa_{1-x})_yIn_{1-y}P$ layer 2a only at the current injecting region, as shown in FIG. 3.

As for the selective formation of this p type $(Al_xGa_{1-x})_yIn_{1-y}P$ layer 2, the layer 2 may be selectively grown only at the current injecting region employing an $SiO_2$ film or an SiN film as a selective growth mask, and thereafter the mask comprising the $SiO_2$ film or the SiN film may be removed with fluorine, thereby completing the selective formation of the layer 2.

Next, the p type ZnSe cladding layer 3, the ZnSe active layer 4, the n type ZnSe cladding layer 5, and the n$^+$ type ZnSe contact layer 6 are successively epitaxially grown thereon by MBE, MOCVD, CBE, GSMBE, or the like.

In addition, a p side electrode 8 is formed at a rear surface of the p type GaAs substrate 1 and an n side electrode 9 is formed on the n$^+$ type ZnSe contact layer 6.

When a forward direction voltage is applied between the p type GaAs substrate 1 and the n$^+$ type ZnSe contact layer 6, a current flows only through the p type $(Al_xGa_{1-x})_yIn_{1-y}P$ buffer layer 2 from the p type GaAs substrate 1 because energy barrier spikes about 1.4 eV high exist in the valence band. Those spikes are due to the energy discontinuity between the p type GaAs substrate 1 and the p type ZnSe cladding layer 3, whereby a current confinement structure is produced. As a result, a distribution would occur in the holes that are injected into the ZnSe active layer 4, thereby causing light emission in this portion.

In the semiconductor light emitting element according to the eighth embodiment of the present invention, the p type $(Al_xGa_{1-x})_yIn_{1-y}P$ buffer layer 2 is selectively grown on the GaAs substrate 1, whereby a current confinement structure is fabricated utilizing spikes generated by the energy discontinuity between semiconductor layers, and the semiconductor laser can employ the laminated layer structure according to any of the previously described embodiments.

Although in this eighth embodiment the p type $(Al_xGa_{1-x})_yIn_{1-y}P$ buffer layer 2a relaxes the band gap energy discontinuity between the p type GaAs substrate 1 and the p type ZnSe cladding layer 3, this buffer layer may be an $Al_zGa_{1-z}As$ layer as described in the fourth embodiment.

Although in the first to eighth embodiments ZnSe is employed as a II–VI semiconductor, ZnS, CdSe, CdS, MgSe, MgS, or mixtures thereof may be employed as the II–VI semiconductor with the same effects as in the other embodiments.

Although in the first to eighth embodiments the laser structure comprises a double heterojunction structure, a quantum well structure may be employed for the active layer with the same effects as in the other embodiments.

What is claimed is:

1. A semiconductor light emitting element comprising:

a p type GaAs substrate having a band gap energy;

a p type ZnSe layer disposed on said GaAs substrate and having a band gap energy; and a p type $(Al_xGa_{1-x})_yIn_{1-y}P$ buffer layer disposed between said p type GaAs substrate and said p type ZnSe layer and having a band gap energy larger than the band gap energy of said p type GaAs substrate and smaller than the band gap energy of said ZnSe layer wherein $0<x<1$, $0.16<y<1$ and the band gap energy of said buffer layer monotonically increases from 1.42 eV to 2.45 eV from said p type GaAS substrate to said p type ZnSe layer.

2. A semiconductor light emitting element comprising:

a p type GaAs substrate having a band gap energy;

a p type ZnSe layer disposed on said p type GaAs substrate and having a band gap energy; and a buffer layer of $(Al_zGa_{1-z})As$, wherein $0<z<1$, disposed between said p type GaAs substrate and said ZnSe layer and having a band gap energy larger than the band gap energy of said p type GaAs substrate and smaller than the band gap energy of said ZnSe layer.

3. A semiconductor light emitting element comprising:

a p type III–V semiconductor substrate having a band gap energy;

a wide band gap energy II–VI semiconductor layer disposed on said p type III–V semiconductor substrate and having a band gap energy;

a III–V semiconductor buffer layer disposed between said III–V semiconductor substrate and said wide band gap energy II–VI semiconductor layer and having a band gap energy larger than said III–V semiconductor substrate;

a III–V semiconductor layer having a band gap energy larger than said III–V semiconductor substrate disposed on only part of said III–V semiconductor substrate as a current injecting region.

4. The semiconductor light emitting element of claim 3 wherein:

said III–V semiconductor substrate is GaAs;

said wide band gap energy II–VI semiconductor layer is p type ZnSe; and said III–V semiconductor layer having a larger band gap energy than said III–V semiconductor substrate is $(Al_xGa_{1-x})_yIn_{1-y}P$.

5. The semiconductor light emitting element of claim 1 wherein said p type $(Al_xGa_{1-x})_yIn_{1-y}P$ buffer layer has a lattice constant that varies with position between said substrate and said ZnSe layer and matches the lattice constant of said ZnSe layer at said ZnSe layer.

* * * * *

UNITED STATES PATENT AND TRADEMARK OFFICE
CERTIFICATE OF CORRECTION

PATENT NO. : 5,539,239
DATED : July 23, 1996
INVENTOR(S) : Kawazu et al.

It is certified that error appears in the above-indentified patent and that said Letters Patent is hereby corrected as shown below:

Column 13, Line 13, change "$0<z<1$" to --$0<z\leq1$--.

Signed and Sealed this

Twelfth Day of November, 1996

Attest:

BRUCE LEHMAN

*Attesting Officer*     *Commissioner of Patents and Trademarks*